(12) United States Patent
Takao

(10) Patent No.: US 6,674,162 B2
(45) Date of Patent: Jan. 6, 2004

(54) SEMICONDUCTOR DEVICE AND MANUFACTURING METHOD THEREOF

(75) Inventor: Yukihiro Takao, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 150 days.

(21) Appl. No.: 09/804,243

(22) Filed: Mar. 13, 2001

(65) Prior Publication Data

US 2001/0026954 A1 Oct. 4, 2001

(30) Foreign Application Priority Data

Mar. 30, 2000 (JP) ........................................ 2000-092688

(51) Int. Cl.[7] ............................ H01L 23/12; H01L 23/48
(52) U.S. Cl. ......................... 257/700; 257/701; 257/758
(58) Field of Search ............................ 438/106; 257/700, 257/701, 709, 668, 779, 780, 758; H01L 23/12, 23/48

(56) References Cited

U.S. PATENT DOCUMENTS

| | | | | |
|---|---|---|---|---|
| 5,117,280 A | * | 5/1992 | Adachi | 257/669 |
| 5,172,212 A | * | 12/1992 | Baba | 257/738 |
| 5,569,960 A | * | 10/1996 | Kumazawa et al. | 257/738 |
| 5,977,641 A | * | 11/1999 | Takahashi et al. | 257/778 |
| 6,103,552 A | * | 8/2000 | Lin | 29/4.6 |
| 6,184,062 B1 | * | 2/2001 | Brofman et al. | 438/106 |
| 6,285,083 B1 | * | 9/2001 | Imai et al. | 257/773 |
| 6,326,701 B1 | * | 12/2001 | Shinogi et al. | 257/797 |
| 6,329,288 B1 | * | 12/2001 | Tokushige et al. | 438/675 |
| 6,351,035 B2 | * | 2/2002 | Lin | 257/727 |
| 6,387,734 B1 | * | 5/2002 | Inaba et al. | 438/125 |
| 6,395,164 B1 | * | 5/2002 | Andricacos et al. | 205/157 |
| 6,400,019 B1 | * | 6/2002 | Hirashima et al. | 257/737 |
| 6,479,900 B1 | * | 11/2002 | Shinogi et al. | 257/758 |
| 2002/0096757 A1 | * | 7/2002 | Takao et al. | 257/690 |

FOREIGN PATENT DOCUMENTS

JP  2000-228420  *  8/2000  ........... H01L/21/60

OTHER PUBLICATIONS

Centrifugal Stretching of C4 Joints, IBM technical Disclosure Bulletin; Mar. 1985, vol. 27, Issue number 10B, pp. 6198–6200.*

Nikkei Microdevices, p. 44–71, Aug. 1998 (with English translation of pp. 48–49).

* cited by examiner

*Primary Examiner*—Don Wong
*Assistant Examiner*—Trinh Vo Dinh
(74) *Attorney, Agent, or Firm*—Morrison & Forester LLP

(57) ABSTRACT

The present invention is directed to improving the reliability of a chip size package mounted on a print board. A metal post 9 is formed in such way that the top surface thereof is larger than the bottom surface, and that the metal post 9 is thinner in the middle than at its both ends. A solder ball 12 is mounted on the top surface of the metal post 9, achieving a larger contact area S' between the metal post 9 and the solder ball 12 than that of the conventional art, which leads to the increased endurance against shear stresses. Furthermore, when the metal post 9 is made thinner in the middle than at its both ends, the metal post 9 is flexible in the lateral direction, and thus capable of further dissipating the stresses accumulated in the boundary area.

3 Claims, 8 Drawing Sheets before heating after heating

150°C
for 5minites

180°C
for 5minites

200°C
for 5 minites a cross sectional
view after heating $b \leqq a < c$

Present Invention

SEMICONDUCTOR DEVICE AND MANUFACTURING METHOD THEREOF

TECHNICAL FIELD

This invention relates to a semiconductor device and a manufacturing method thereof and, in particular, to a technology for improving the reliability of chip size package. The chip size package, also called CSP, includes the package of the same size as a chip as well as the package of a size slightly larger than a chip, and is used for achieving highly concentrated mounting. The present invention relates to the technology for improving the reliability of such chip size package.

BACKGROUND ART

In the filed described above, two structures have been used; namely, ball grid array (BGA) in which solder balls are aligned in a plane and fine-pitch BGA in which the ball pitch of the BGA is further reduced for making the package size closer to the chip size.

Also, the wafer CSP, which was described on pages 44–71 of the August issue of 'The Nikkei Micro Device', 1998, has attracted a lot of attentions. The wafer CSP is basically a CSP in which wires and arrayed pads are formed during the wafer process (the upstream process) before the dicing of chips. Through this method, the wafer process and the packaging process (the downstream process) can be combined into one process. Thus, it is expected to decrease the packaging cost through this technology.

There are two types of chip size package, the resin sealing type and the rewiring type. As the same as the conventional package, the resin sealing type has a configuration in which the surface of the substrate is covered with sealing resin. In particular, metal posts are formed directly on the wiring layer of the chip surface, and both the metal posts and the wiring layer are buried in the sealing resin. When the package is mounted on a print board, the stresses generated by the difference in the thermal expansion between the print board and the package are concentrated on the metal posts. It is known that the longer the metal post is, the more the generated stresses are dissipated.

On the other hand, as shown in FIG. 13, the rewiring type has a configuration in which rewiring is formed without the use of resin sealing. In this configuration, the Al electrode 52, the wiring layer 53 on which the metal post 55 having the solder ball 56 (also called solder bump) thereon is formed, and the insulating layer 54 are laminated on the surface of the chip 51. The wiring layer 53 is used for rewiring in order to arrange the solder balls 56 in accordance with a predetermined array design on the chip.

In case of the resin sealing type, the metal post is about a few μm long and reinforced with the sealing resin, resulting in a high reliability. However, in order to form the resin sealing, it is necessary to use a metal die in the downstream process, which makes the process complicated. On the other hand, the rewiring type requires relatively simple processing. An advantage of the rewiring type is to be able to perform almost all the processes by wafer processing. However, the rewiring type needs to improve the reliability by dissipating the stresses in one way or another.

FIG. 14 is a cross-sectional view of a configuration in which the chip size package 57 is mounted on a print board 61. The solder ball 56 is pressed against and adhered to a copper electrode 60 of the wiring on the print board 61 for electrical connection between the package and the print board. However, since there is a difference in the thermal expansion coefficient between the print board 61 and the chip size package 57, the solder ball 56 is often ruptured when the mounted package undergoes thermo-cycle tests. Especially, it is known that large shear stresses are generated at the boundary between the solder ball 56 and the metal post 55.

It would be desirable to improve the endurance of the chip size package against the shear stresses for improving its reliability when it is mounted on a print board.

SUMMARY OF THE INVENTION

The present invention is directed to a semiconductor device having a high endurance against shear stresses at a boundary between a solder ball for external connection and a metal post connected to semiconductor circuits, and a manufacturing method of the semiconductor device. According to the present invention, there is provided a semiconductor device having a metal electrode pad formed on a semiconductor substrate, a wiring layer connected to the metal electrode pad and laid out on a surface of the semiconductor substrate, an insulating layer covering the surface of the semiconductor substrate including the wiring layer on the surface, an opening formed in the insulating layer, a metal post formed on the wiring layer exposed in the opening, and a solder ball mounted on the top surface of the metal post. The surface area of the top surface of the metal post is made lager than the surface area of the bottom surface of the metal post.

In this configuration, since the bonding strength of the boundary between the metal post and the solder ball against shear stress is proportional to the contact area of the two, it is possible to increase the shear strength of the boundary by making the surface area of the top surface of the metal post larger and, thereby, making its contact area with the solder ball mounted thereon larger. As the bottom surface of the metal post can be made relatively small, it is also possible to make the wirings of the wiring layer thin while maintaining high shear strength, leading to further miniaturization of the wiring structure.

Furthermore, when the metal post is made thinner in the middle than at its both ends, the metal post is flexible in the lateral directions, and, thus, capable of further dissipating the stresses generated by the difference in the thermal expansion.

According to another aspect of the present invention, there is also provided a method of manufacturing a semiconductor device having the steps of forming a wiring layer on a substrate of the semiconductor device, forming a photoresist layer on the wiring layer, forming an opening in the photoresist layer by exposure and development of the layer, heating the photoresist layer for making the opening larger at its upper end, forming a metal post in the opening in the photoresist layer deformed by the heating, and mounting a solder ball on the top surface of the metal post.

During the heating of the photoresist layer, a portion of the photoresist layer around the upper end of the opening in the photoresist layer recedes from the initial position before the heating. This makes the opening lager at its upper end, and the resultant shape of the opening is reflected on the shape of the metal post which is formed in the opening of the photoresist layer. As a result, the surface area of the top surface of the metal post is made larger than the surface area of its bottom surface, leading to an increased contact area between the metal post and the solder ball mounted thereon and, thus, improved shear strength of the boundary between the two among other improvements, as described above.

Furthermore, when the photoresist is heated at about 200° C. or higher, it is possible to make the metal post thinner in the middle than at its both ends. This makes the metal post flexible in the lateral directions, and, thus, capable of dissipating the stresses accumulated in the boundary area with improved efficiency, as described above.

DESCRIPTION OF THE INVENTION

Figure 1:
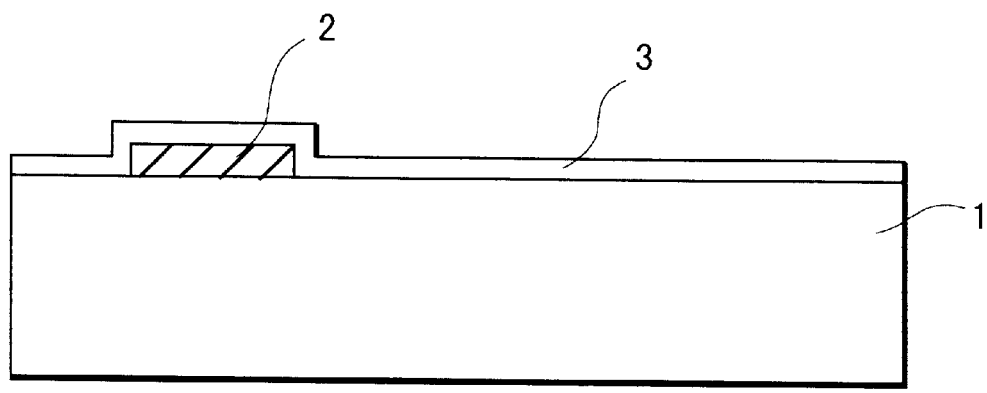
FIG. 1 is a cross-sectional view of a process intermediate of a semiconductor device according to a manufacturing method of an embodiment of the present invention.

First, as shown in FIG. 1, a semiconductor substrate 1, for example a silicon wafer, on which LSI circuit and an Al electrode pad 2 are formed, is provided as a precursor. The Al electrode pad 2 is for external connection of the LSI and of thickness of about 1 μm. The surface of the semiconductor substrate 1 is covered with a passivation film 3 comprising Si3N4 film and the like deposited by LPCVD method. The passivation film 3 is about 1 μm in thickness.

Figure 2:
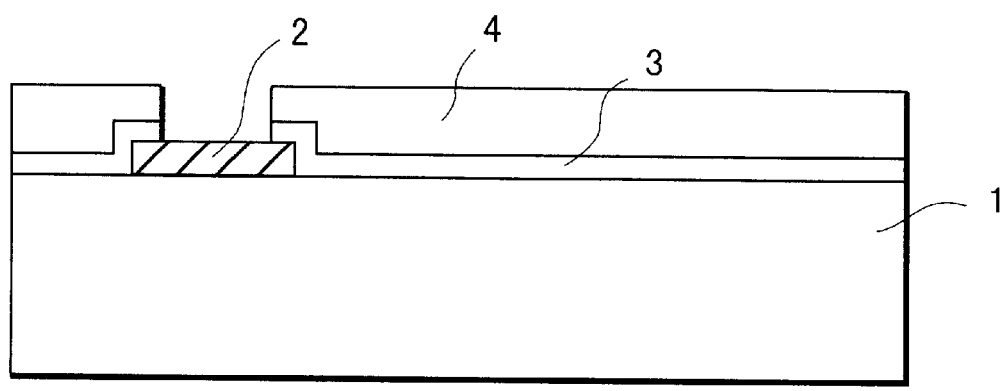
FIG. 2 is a cross-sectional view of a process intermediate of a semiconductor device according to a manufacturing method of an embodiment of the present invention.

Then, as shown in FIG. 2, a polyimide film 4, which is 3–5 μm in thickness, is formed over the entire surface to provide a flat surface. A part of the passivation film as well as the polyimide film 4 above the Al electrode pad 2 is selectively removed to expose the top surface of the Al electrode pad 2.

In the process above, a photoresist (not shown) having an opening above the Al electrode pad 2 is used as a mask, and the polyimide film 4 is etched with an alkaline developing solution. Then, the polyimide film 4 is used as a mask for removing the passivation film 3 underneath by dry-etching. Reactive ion etching using CHF3+O2 gas and chemical dry etching using CF4+O2 gas can be used for dry-etching the passivation film 3.

Figure 3:
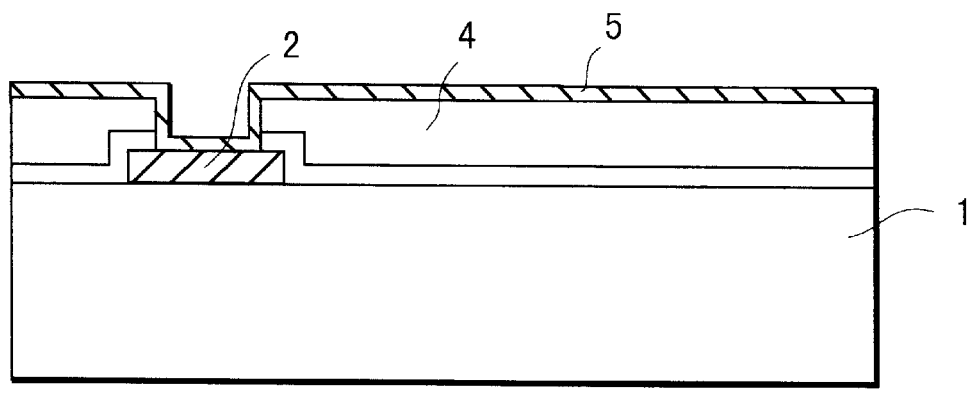
FIG. 3 is a cross-sectional view of a process intermediate of a semiconductor device according to a manufacturing method of an embodiment of the present invention.

Further, as shown in FIG. 3, the electrode layer 5 for plating (also called the seed layer) made of copper is formed by sputtering.

Figure 4:
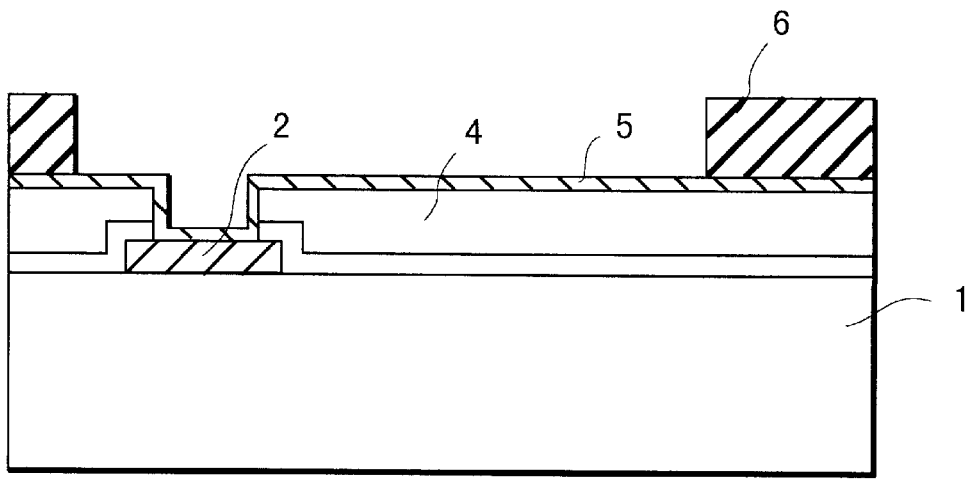
FIG. 4 is a cross-sectional view of a process intermediate of a semiconductor device according to a manufacturing method of an embodiment of the present invention.
Figure 5:
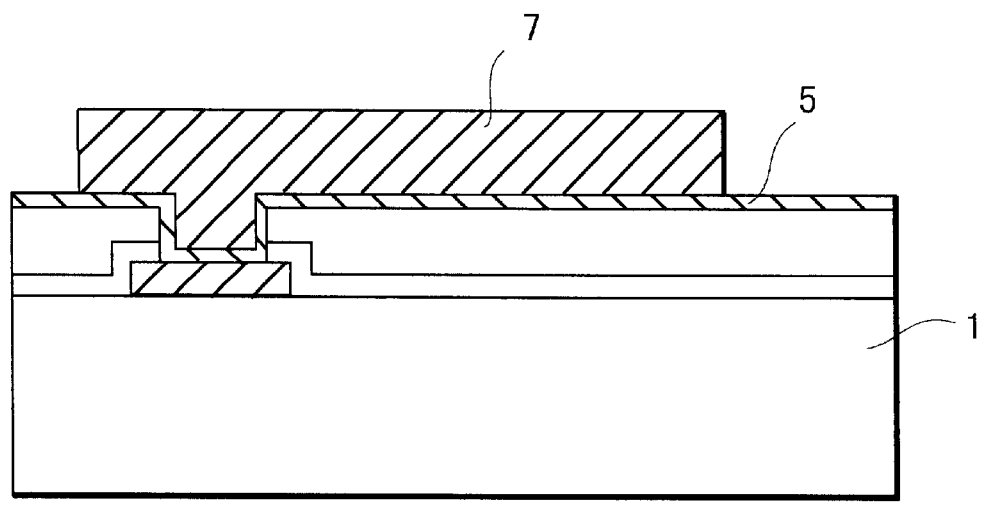
FIG. 5 is a cross-sectional view of a process intermediate of a semiconductor device according to a manufacturing method of an embodiment of the present invention.

In the next step, a wiring layer, which is connected to the Al electrode pad 2, is formed. The wiring layer needs to be about 5 μm in thickness in order to achieve enough mechanical strength and it is adequate to employ a plating method to form the wiring layer. Then, as shown in FIG. 4, a first patterned photoresist layer 6 is formed on the electrode layer 5 for plating. As shown in FIG. 5, the wiring layer 7 made of copper is formed by electrolytic plating in the area where the first patterned photoresist layer 6 has not been formed. The first patterned photoresist layer 6 is, then, removed.

Figure 6:
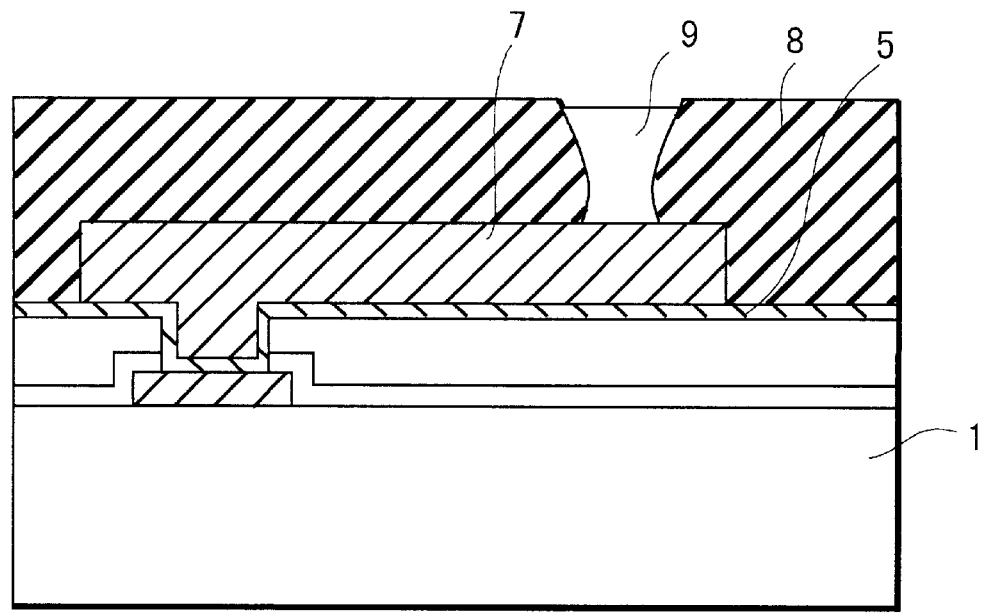
FIG. 6 is a cross-sectional view of a process intermediate of a semiconductor device according to a manufacturing method of an embodiment of the present invention.

A second patterned photoresist layer 8 having an opening at the area where the metal post will be formed on the wiring layer 7 is formed as shown in FIG. 6. The thickness of the second patterned photoresist layer 8 is in accordance with the height of the metal post and, for example, about 100 μm. The opening is formed by exposure and development. Then, the portion of the photoresist layer around the opening is deformed by heating. Using electrolytic plating, the metal post 9 comprising Cu layer is formed in the opening such that the metal post 9 takes the shape of the opening.

Figure 7A:
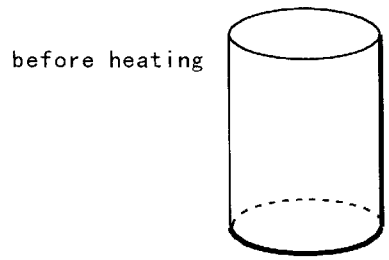
FIGS. 7A, 7B and 7C are schematics to illustrate a change in the shape of the opening formed in the photoresist layer for forming a metal post according to an embodiment of the present invention.
Figure 7B:
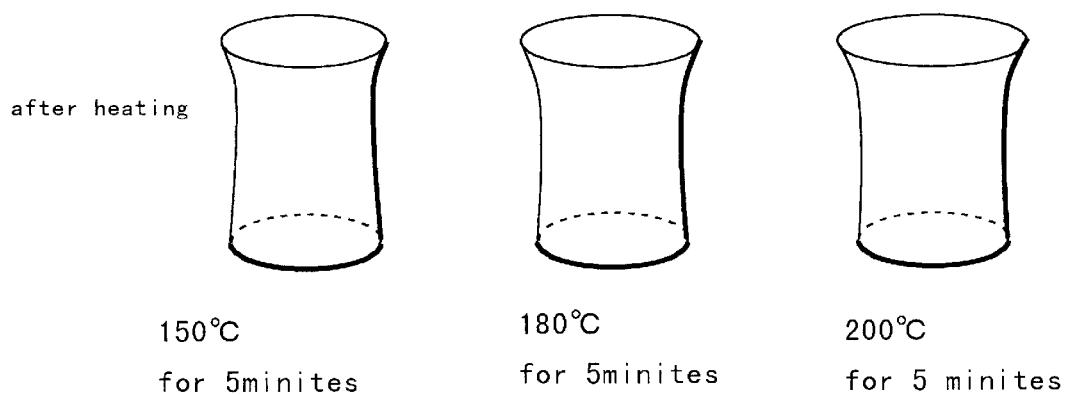

Now, the relationship between the shape of the opening in the patterned photoresist layer 8 and the heating treatment is described by referring to FIG. 7A and FIG. 7B.

As shown in FIG. 7A, the shape of the opening is almost cylindrical right after the exposure and development process. It was learned form experiments, as shown in FIG. 7B, that the photoresist layer around the upper end of the opening recedes when the heating treatment is performed on the patterned photoresist layer 8, and that with the increase in the heating temperature the shape of the opening in the patterned photoresist layer 8 becomes thinner in the middle than at its both ends. For example, when the patterned photoresist layer 8 is heated at 150° C. for 5 minutes, only the upper end of the opening is enlarged because of the receding of the photoresist layer of the corresponding area. But, when heated at 200° C. for 5 minutes, the photoresist layer further recedes and the opening becomes thinner in the middle than at its both ends.

Figure 7C:
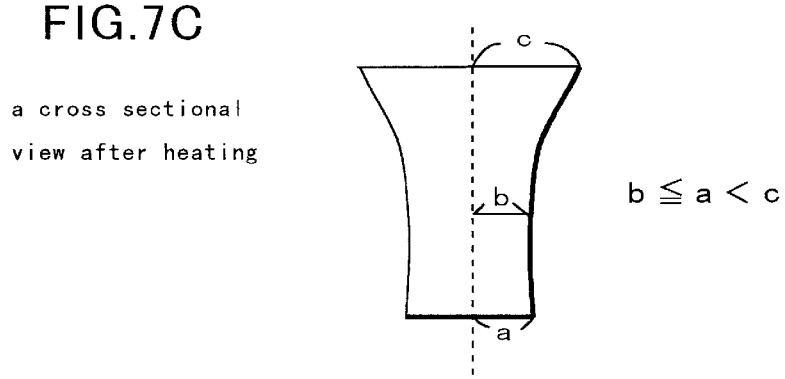

That is, the opening in the photoresist layer becomes thinner in the middle than at its both ends as the heating temperature increases. As shown in FIG. 7C, the relationship can described as $b \leq a < c$, where a is the radius of the bottom surface of the opening, b is the radius of the opening at its thin part, and c is the radius of the top surface of the opening. Here, the shape of the bottom as well as the top surface of the opening is almost circular.

For example, heating at 200° C. of (b) results in a of 50 μm and c of 60 μm with a surface area ratio of 1.44 (Sc≈1.44 Sa). This ratio means that the surface area of the top surface of the opening in the photoresist layer is larger than that of the bottom surface, and that there is a horizontal cross-sectional area in the middle, the surface area of which is smaller than bottom surface.

Figure 8:
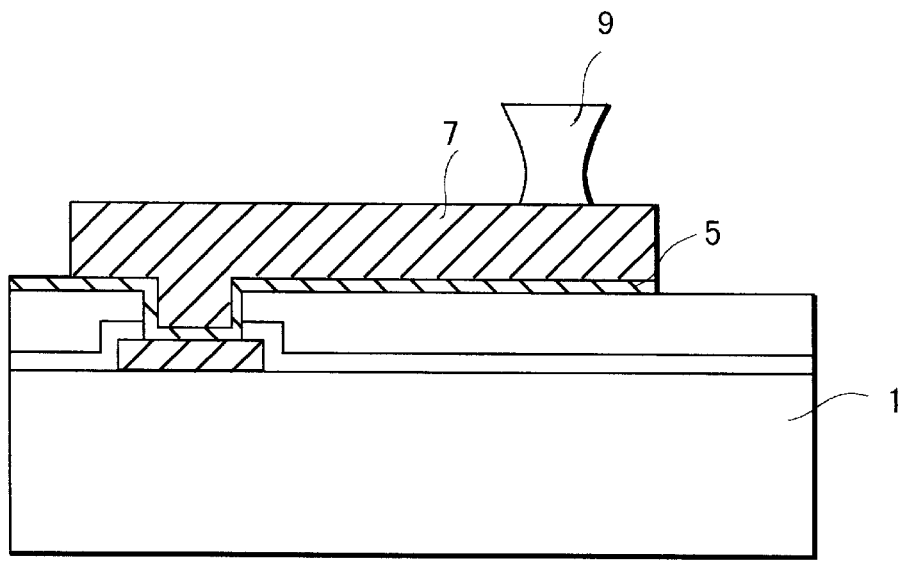
FIG. 8 is a cross-sectional view of a process intermediate of a semiconductor device according to a manufacturing method of an embodiment of the present invention.

In the next step, as shown in FIG. 8, the second patterned photoresist layer 8 is removed by using resist-peeling agent. Furthermore, by using a mixed solution of nitric acid and acetic acid, the electrode layer 5 for plating is removed except the portion of the electrode layer 5 underneath the wiring layer 7.

Figure 9:
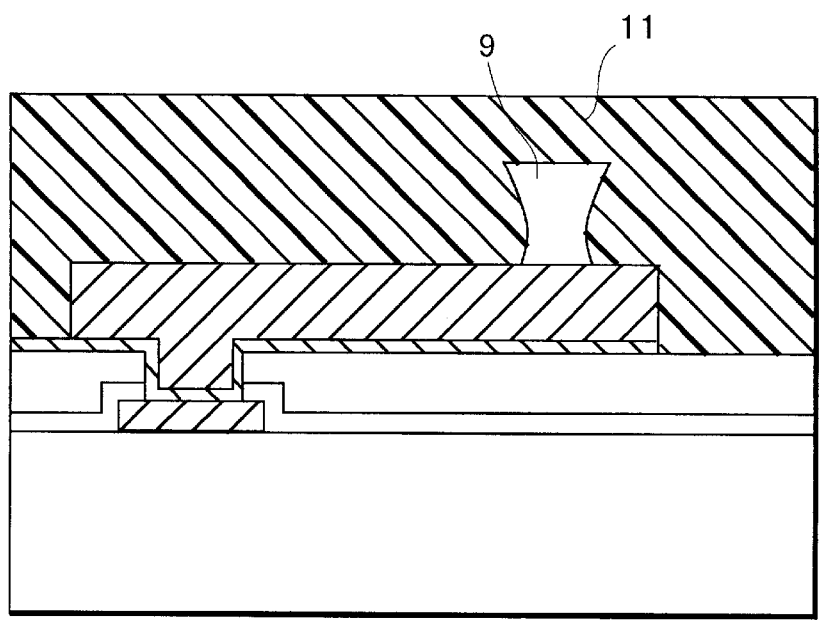
FIG. 9 is a cross-sectional view of a process intermediate of a semiconductor device according to a manufacturing method of an embodiment of the present invention.

Then, as shown in FIG. 9, the wiring structure formed through the steps described above is sealed with the insulating layer 11 comprised of either a polyimide layer or a mold resin layer. The insulating layer 11 should be thick enough to bury the metal post 9 therein.

Figure 10:
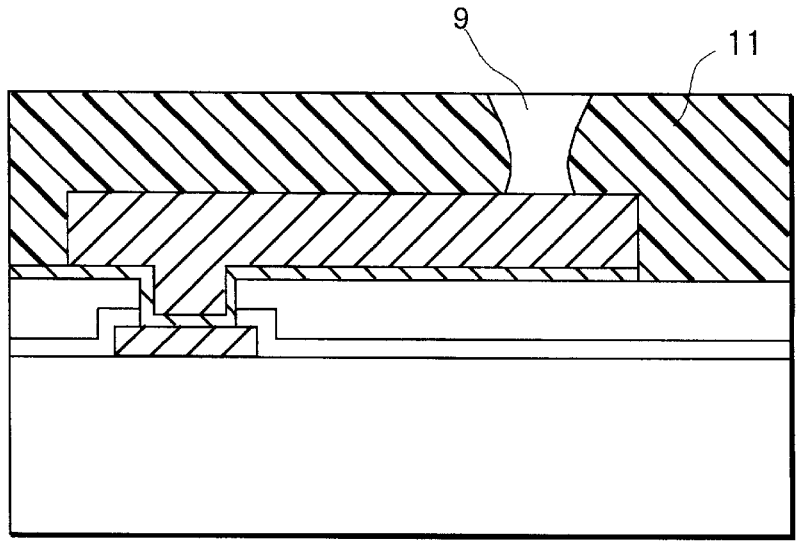
FIG. 10 is a cross-sectional view of a process intermediate of a semiconductor device according to a manufacturing method of an embodiment of the present invention.

As shown in FIG. 10, the surface of the insulating layer 11 is polished to expose the top surface of the metal post 9. Polishing may be performed using a back grind apparatus or by the CMP (chemical mechanical polishing) method. When the back grind apparatus is used, it may be preferable to perform a back side polishing on the wafer after the polishing step above.

Figure 11:
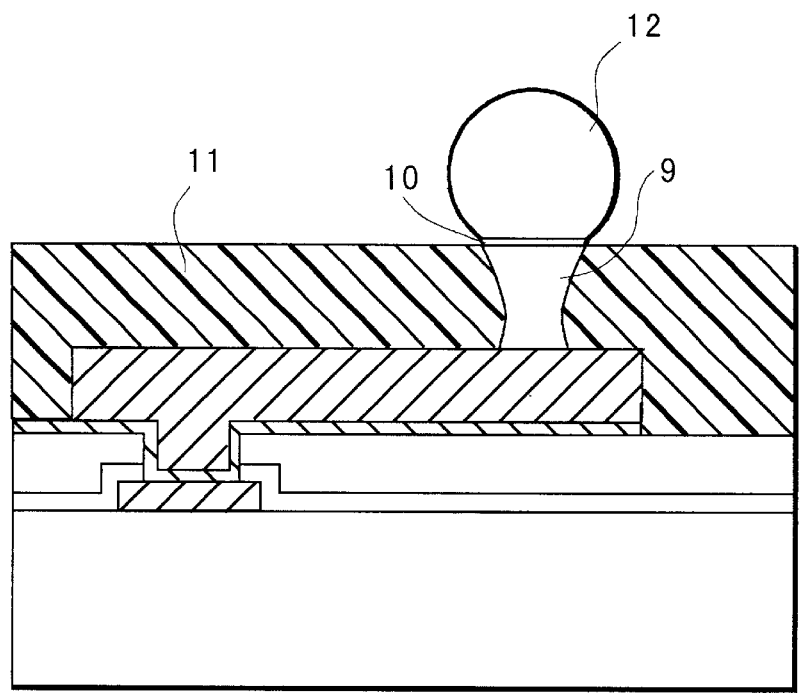
FIG. 11 is a cross-sectional view of a process intermediate of a semiconductor device according to a manufacturing method of an embodiment of the present invention.

Next, as shown in FIG. 11, on the top surface of the metal post 9 exposed the barrier layer 10 comprising Au/Ni layer is formed by non-electrolytic plating. Then, the solder ball 12 is pressed against and adhered to the barrier layer 10, for mounting thereon, using publicly known methods including vacuum suction method.

Through these steps, there is provided a wafer having individual LSI chips and solder balls 12 mounted on the LSI chips as a terminal for external connection. Then, along the scribe lines of the LSI, the wafer is divided into individual chips by using a dicing device. The separated individual LSI chip is now mounted, for example, on a print board as a chip size package.

Figure 12A:
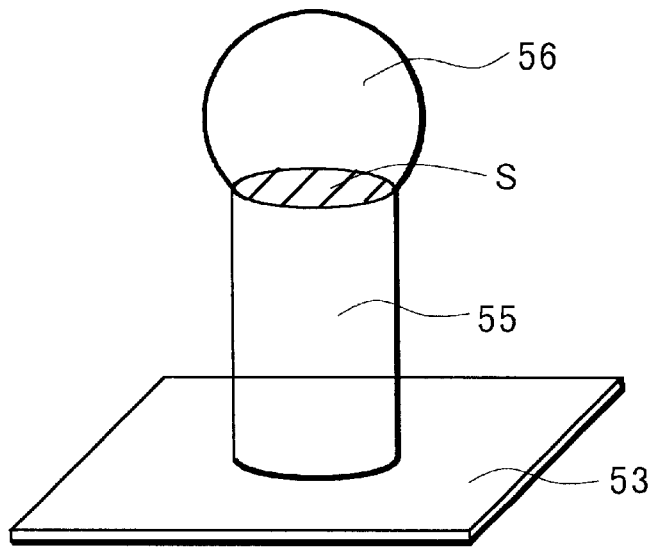
FIG. 12A is a perspective view of a metal post and a solder ball mounted thereon according to a conventional configuration.
Figure 12B:
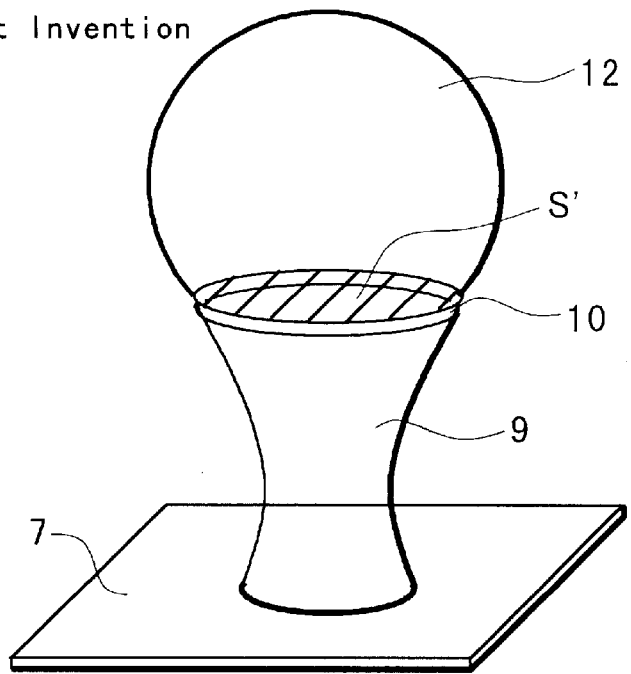
FIG. 12B is a perspective view of a metal post and a solder ball mounted thereon according to an embodiment of the present invention.
Figure 13:
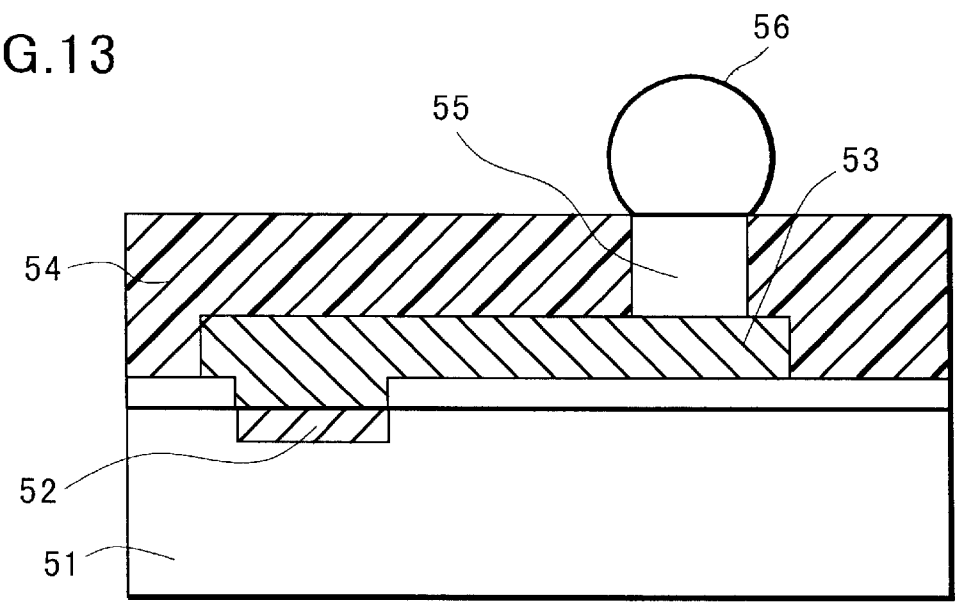
FIG. 13 is a cross-sectional view of a chip size package of the conventional art.
Figure 14:
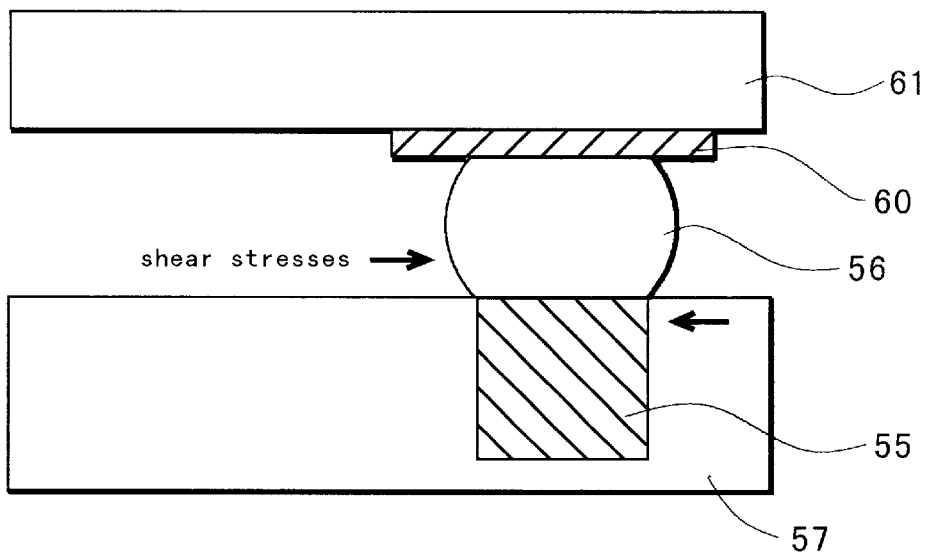
FIG. 14 is a cross-sectional view illustrating the chip size package mounted on a substrate.

FIG. 12A and 12B are enlarged perspective views of the metal post 9 and the solder ball 12 of FIG. 9. As seen from the figures, the present invention can achieve a larger contact area S' between the solder ball 12 and the metal post 9 in comparison to that S of the prior art. Since the configuration of the semiconductor device formed by the steps described herein can make the contact area larger when it is mounted on a print board, the stresses generated at the metal post 9, which is due to the difference in the thermal expansion between the package and the print board and of shear nature, are dissipated and, thus, the reliability is improved. Furthermore, when the metal post 9 is made thinner in the middle than at its both ends, the metal post 9 is flexible in the lateral directions, and, thus, capable of further dissipating the stresses generated by the difference in the thermal expansion. Still furthermore, since the surface area of the bottom surface of the metal post 9 is smaller than that of the top surface, it is possible to make the rewiring structure finer, leading to further miniaturization of the wiring structure.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be within the scope of the following claims.

What is claimed is:

1. A semiconductor device, comprising:
   a metal electrode pad formed on a semiconductor substrate;
   a wiring layer connected to the metal electrode pad and laid out on a surface of the semiconductor substrate;
   an insulating layer covering the surface of the semiconductor substrate including the wiring layer thereon;
   an opening formed in the insulating layer;
   a metal post formed on the wiring layer exposed through the opening; and
   a solder ball mounted on the top surface of the metal post,
   wherein the surface area of the top surface of the metal post is larger than the surface area of the bottom surface of the metal post, the metal post is thinner at a central portion thereof than both ends of the metal post, and the top surface of the metal post is substantially in plane with a top surface of the insulating layer.

2. The semiconductor device of claim 1, wherein the metal post comprises a Cu layer formed by electrolytic plating.

3. A semiconductor device, comprising:
   a metal electrode pad formed on a semiconductor substrate;
   a wiring layer connected to the metal electrode pad and laid out on a surface of the semiconductor substrate;
   an insulating layer covering the surface of the semiconductor substrate including the wiring layer thereon;
   a metal post formed in the insulating layer, a bottom end of the metal post being in contact with the wiring layer, and a top end of the metal post being substantially in plane with a top surface of the insulating layer; and
   a solder ball mounted on the top end of the metal post,
   wherein the surface area of the top end of the metal post is larger than the surface area of the bottom end of the metal post.

* * * * *